United States Patent [19]

Amorosi et al.

[11] Patent Number: 4,619,395
[45] Date of Patent: Oct. 28, 1986

[54] LOW INERTIA MOVABLE WORKSTATION

[75] Inventors: Vincent G. Amorosi, Horsham; Gautam N. Shah, Warrington; Mark B. Soffa, Philadelphia; David A. Leonhardt, Norristown; Gary L. Gillman, Warminister, all of Pa.

[73] Assignee: Kulicke and Soffa Industries, Inc., Willow Grove, Pa.

[21] Appl. No.: 784,629

[22] Filed: Oct. 4, 1985

[51] Int. Cl.[4] ............................................. B23K 37/04
[52] U.S. Cl. ..................................... 228/4.5; 228/6.2; 228/44.7; 228/49.1
[58] Field of Search ..................... 228/4.5, 6.2, 44.7, 228/49.1, 110, 179, 212

[56] References Cited

U.S. PATENT DOCUMENTS

| | | | |
|---|---|---|---|
| 3,149,510 | 9/1964 | Kulicke, Jr. | 228/6.2 |
| 3,477,630 | 11/1969 | Schneider | 228/6.2 |
| 3,774,834 | 11/1973 | Holler et al. | 228/6.2 |
| 4,039,114 | 8/1977 | Yoshida et al. | 228/4.5 |
| 4,103,814 | 8/1978 | Nishioka | 228/6.2 |
| 4,239,144 | 12/1980 | Elles et al. | 228/1.1 |
| 4,266,710 | 5/1981 | Bilane et al. | 228/1.1 |
| 4,404,741 | 9/1983 | Lebet et al. | 228/6.2 |

Primary Examiner—Nicholas P. Godici
Assistant Examiner—Samuel M. Heinrich
Attorney, Agent, or Firm—John B. Sowell

[57] ABSTRACT

The present invention provides a new and improved workstation for holding a semiconductor device opposite the bonding tool of an automatic wire bonder during a bonding operation. The workstation is mounted on a retractable pedestal which is vertically and rotationally movable by a high speed vertical axis drive motor and a high speed theta drive motor which are mounted on a workstation base in fixed positions and coupled to said pedestal for imparting motion thereto. The movable pedestal and workstation are adapted to unload a semiconductor device from a boat or holder and accurately position the top of the semiconductor device at a predetermined bonding height opposite the bonding tool. The workstation and pedestal are retractable to return the semiconductor device to the holder and the control means are adapted to move the holder horizontally to index a new semiconductor device over the workstation prior to the semiconductor device being unloaded from the holder and positioned opposite the bonding tool of an automatic wire bonder.

19 Claims, 6 Drawing Figures

LOW INERTIA MOVABLE WORKSTATION

BACKGROUND OF THE INVENTION

1. Field of the Invention

The present invention relates to processor controlled automatic wire bonders and more particularly to a new and improved workstation for use with semiconductor device holders or boats that support and position semiconductor devices over the workstation.

2. Description of the Prior Art

Automatic wire bonders are commercially available which provide different combinations of movable bonding heads and/or movable workstations. U.S. Pat. No. 4,266,710 shows a high speed vertically movable bonding head on an automatic ball wire bonder which cooperates with a workstation mounted on a movable X-Y table. Movable X-Y tables made and sold by Kulicke and Soffa Industries, Inc. of Horsham, PA may be adapted to support the bonding head mechanism or the workstation of an automatic wire bonder.

U.S. Pat. No. 4,239,144 shows a vertically moving bonding head for an automatic wedge wire bonder of the type employing a movable X-Y table for supporting a workstation. The wedge bonding head is movable in a rotary or theta direction to permit fine wire interconnections to be made between a first bond position on a semiconductor device and a second bond position or lead-out pad on a carrier or substrate in a radial direction.

These prior art automatic wire bonders move the workstation and workpiece in an X and Y direction relative to the bonding tool to form the wire bond interconnection. The semiconductor device is mounted on a workstation which is shown in a stationary position in a vertical axis.

The prior art automatic wire bonders complete the fine wire interconnection between the first and second bond in approximately 250 milliseconds which places acceleration forces of several times the force of gravity on the semiconductor on the workstation. The time required for positioning the semiconductor and the workstation on such X-Y tables is directly proportional to the mass of the moving tables and inversely proportionally to the forces being applied by the drive motors. Any increase in mass of the workstation will result in slowing down the time required to move the X-Y table and to complete a fine wire interconnection.

Holders (hereinafter called boats) and carriers for feeding a plurality of semiconductors to a workstation are known. When automatic loading and unloading machines are used in conjunction with automatic wire bonders, a large number of semiconductor devices may be wire bonded without the requirement of an operator or attendant to attend the machine and assure that individual semiconductor devices are properly positioned on the workstation prior to the bonding operation.

Prior art attempts to incorporate fast acting loading and unloading machines into the moving parts of an automatic wire bonder have not been satisfactory because the mass of the loading and unloading machine components becomes part of the mass of the moving parts of the wire bonders and slows down the operation of the wire bonder. Attempts to use auxillary robots or automatic pick up and placement machines have not been successful because extreme accuracy is required in the placement of the semiconductor devices on the workstations. Accurate robots and transfer devices are available but are relatively heavy and large which results in slowing the operation of the robot and/or transfer device and further are not suited for positioning small precision parts in the close confines of an automatic wire bonder.

It would be desirable to provide a low inertia workstation capable of loading and unloading semiconductor devices from a holder or boat at high speeds.

It would also be desirable to incorporate the loading and unloading mechanism of the workstation into an automatic wire bonder without slowing the operation of the wire bonding machine.

SUMMARY OF THE INVENTION

It is a primary object of the present invention to provide a low inertia vertically movable workstation for positioning a semiconductor device opposite a bonding tool on an automatic wire bonder.

It is another principal object of the present invention to provide a low inertia vertically movable workstation for positioning a semiconductor device in a rotary (or theta) direction relative to a wedge bonding tool on an automatic wedge wire bonder.

It is yet another principal object of the present invention to provide a new and improved movable workstation having a stationary vertical drive motor, a stationary rotary positioning motor and a stationary rotary encoder none of which are movable with the workstation.

It is a general object of the present invention to provide a novel workstation and workstation base which can be installed on existing or new automatic wedge wire bonding machines without the need for redesigning the machine or its mode of operation.

It is another general object of the present invention to provide a vertical and rotary movable workstation which also acts to load and unload a semiconductor device from a device holder to permit high speed automatic wire bonding without the need of a separate material handling machine or the need for an operator to position the semiconductor devices on a workstation.

It is yet another general object of the present invention to provide a rotary positioning workstation drive which has zero backlash.

It is yet another general object of the present invention to provide a high stiffness drive train for a vertically movable workstation which also has low inertia.

In accordance with these and other objects of the present invention there is provided a workstation mounted on a pedestal having a splined shaft on one end which is mounted through a splined aperture or bushing. The workstation is positioned in a rotary direction by forces applied to the splined bushing. The workstation is positioned in the vertical axis by a fixed vertical axis drive motor acting through a vertically fixed rotary screw which engages and moves a pedestal housing supporting the spline shaft and the pedestal which supports the workstation.

DESCRIPTION OF THE PREFERRED EMBODIMENT

Before describing in detail the present invention, it will be understood that the new and improved workstation of the present invention is operable with a Kulicke and Soffa Model 1482 programmable automatic wire bonding machine modified to accept the present workstation and having an ultrasonic bonding head mounted on an X-Y table.

Figure 1:
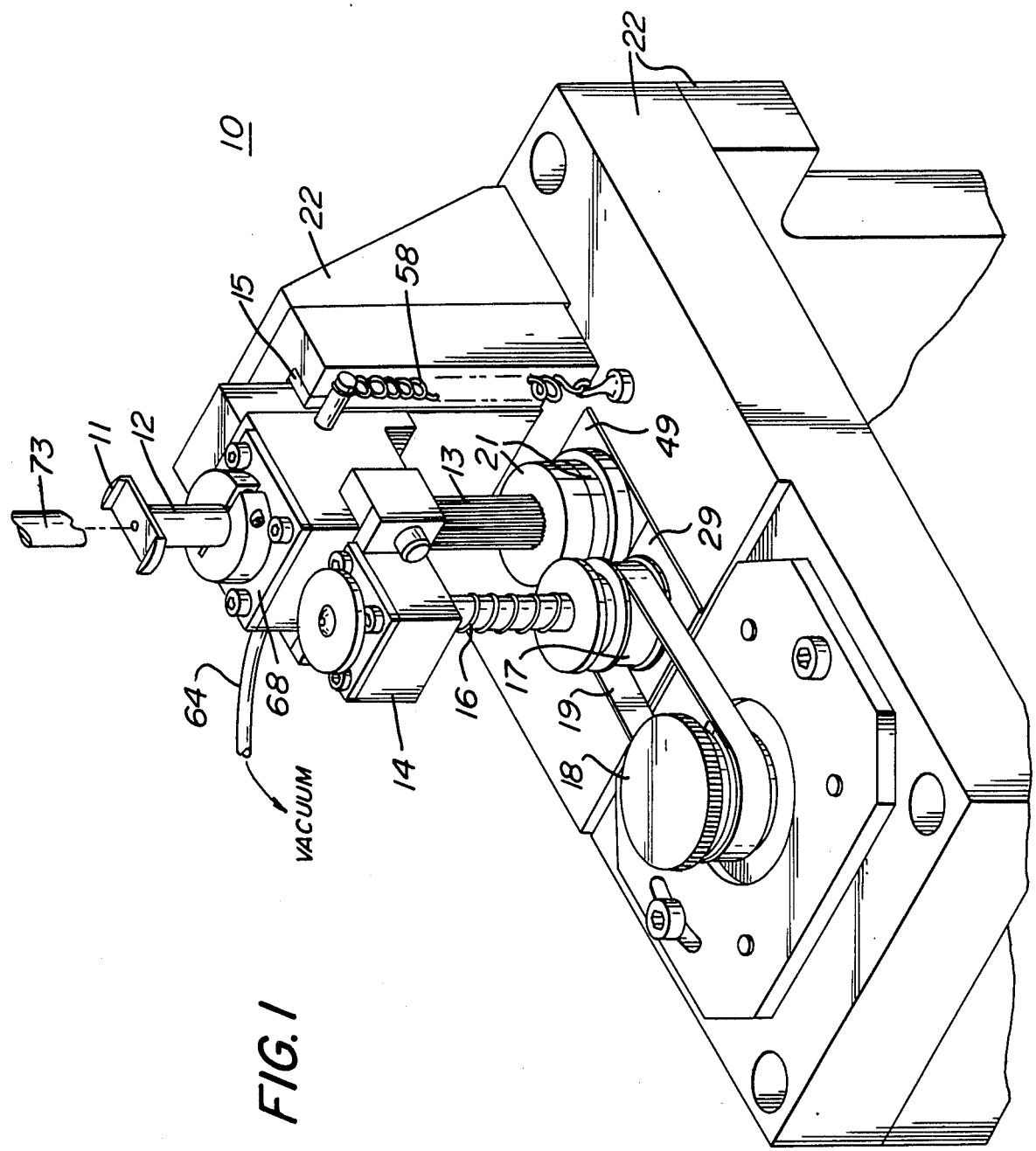
FIG. 1 is an isometric view of the present invention rotary and vertically movable workstation mounted in a workstation base.

Refer to FIG. 1 showing a preferred embodiment workstation assembly 10 which provides rotary/vertical positioning (theta/V) movement. Workstation 11 is mounted on top of vertical pedestal 12 which is an extension of splined shaft 13. Pedestal support frame 14 supports the pedestal 12 and workstation 11 and is slidably guided in vertical slider 15. Frame 14 is moved vertically by vertical lead screws 16 which is driven through pulleys 17, 18 and cogged drive belt 19. Splined shaft 13 is vertically and slidably coupled to apertured splined bushings 21 which also comprise a spring loading element to provide an anti-backlash coupling. The lower spline bushing 21 is fixed to the rotary or theta drive motor as will be explained.

Figure 2:
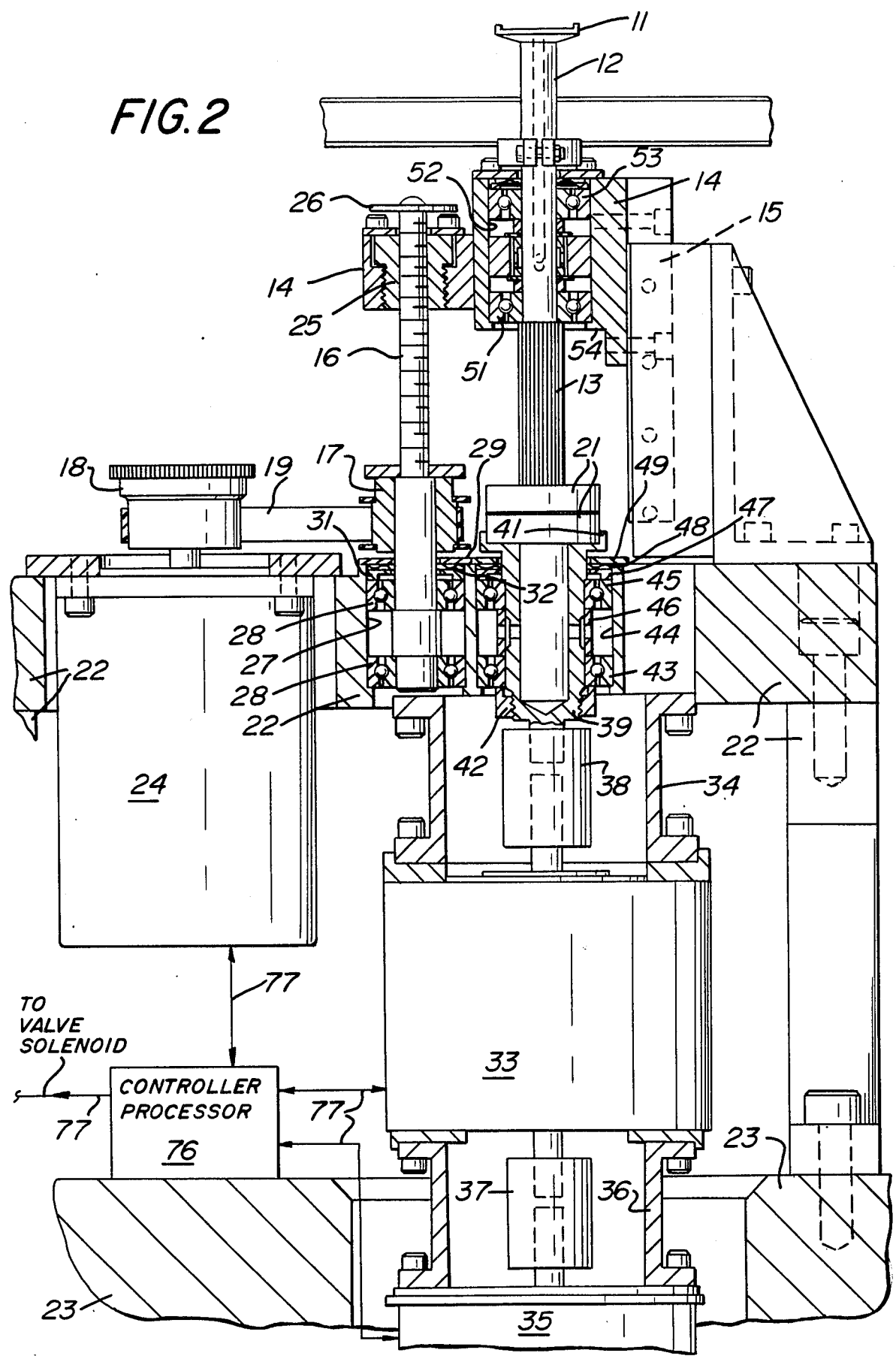
FIG. 2 is a right side elevation in partial section showing the workstation and workstation base of FIG. 1 mounted on the frame of an automatic wire bonder.

Refer to now FIGS. 1 and 2 showing a stationary base 22 mounted on the base frame 23 of the automatic wire bonder. Vertical axis drive motor 24 is shown having a shaft connected to pulley 18 for imparted rotary movement to vertical lead screw 16 which imparts vertical movement to internally threaded bushing 25 fixed in the pedestal support frame 14. An end stop plate 26 is affixed to the top of vertical lead screws 16 to serve as a stop limit.

Stationary base 22 is provided with a circular bore 27 which has a pair of ball bearings 28 mounted therein. The outer races of ball bearings 28 are slip fitted into bore 27. The inner races of bearings 28 are press fitted onto the circular shaft portion of screw 16. The vertical lead screw 16 is biased downward by a bearing cap plate 29 connected to the stationary base 22 and having a pressure plate 31 biased downward by a wave washer 32 intermediate plate 32 and plate 29. These parts are similar to the bearing support structure for supporting the spline shaft 13 and will be explained in greater detail with reference to FIG. 3.

Rotational axis drive motor 33 is shown mounted on frame 22 by motor mounts 34. Similarly, rotary encoder 35 is shown mounted to theta drive motor 33 by encoder mounts 36. Theta drive motor 33 is provided with a shaft coupling 37 which provides anti-backlash coupling to encoder 35. A hollow spindle tube 39 is mounted for rotary movement in frame 22 and coupled to theta drive motor 33 by coupling 38. The upper flange 41 of the hollow spindle tube 39 forms a recess for lower apertured spindle bearing 21. Lock nut 42 is threaded on spindle tube 39 and provides a stop limit for the inner races for the lower ball bearing 43. Lower ball bearing 43 has a slip fitted inner race and outer race and is mounted in bore 44. The upper ball bearing 45 is spaced apart from lower bearing 43 by a cylindrical sleeve 46. The bearing assembly 43, 45 is biased downward by pressure plate 47, wave washer 48 and bearing cap plate 49.

Figure 3:
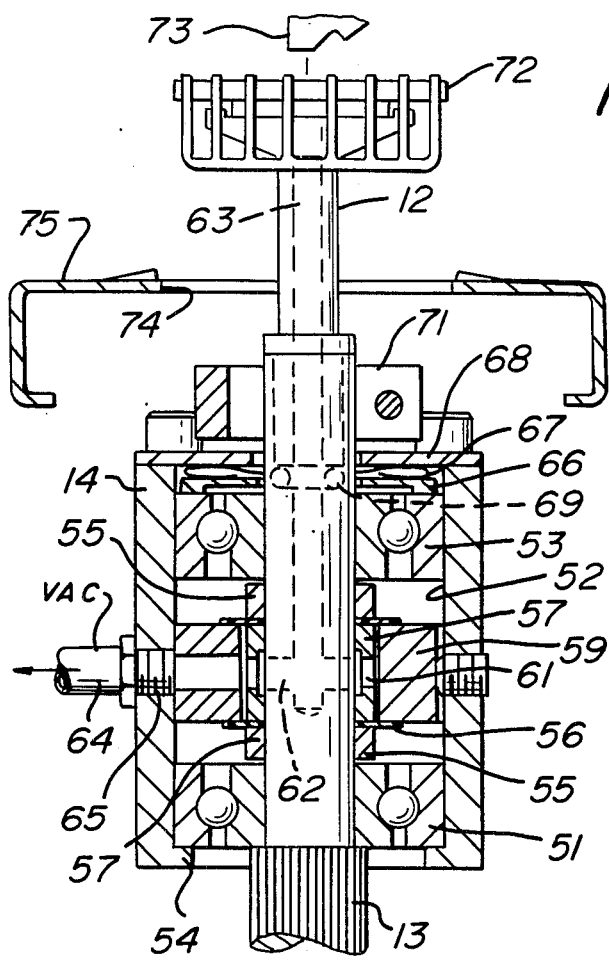
FIG. 3 is an enlarged detailed elevation in partial section of the vertically movable workstation and pedestal support frame showing a semiconductor device mounted on the workstation after being unloaded from a holder.

Refer now to FIGS. 1 to 3 and more particularly to the enlarged detail of FIG. 3 showing the bearing structure for supporting pedestal 12 and the vacuum connection for the workstation 11. Splined shaft 13 is capable of moving vertically through the apertured splined bushings 21 which are spring biased to provide an anti-backlash coupling. Cylindrical pedestal 12 is a part of splined shaft 13 and is mounted for rotary movement in pedestal support frame 14. Lower ball bearing 51 has an inter race fixed to pedestal 12 and an outer race loose fitting in circular bore 52 of frame 14. When an upward force is applied to frame 14 the force is conducted through a flange or shoulder 54 into bearing 51 which is fixed on shaft 12. The force in lower bearing 51 is applied to lower bearing spacer 55, wiper seal 56, spacer sleeve 57, wiper seal 56, bearing spacer 55 to upper ball bearing 53 having its inner race fixed to shaft 12. Thus, it will be understood that any upward or downward force imparted to frame 14 causes the force to be applied through bearings 51 and 53 to shaft 12 and causes the rotary movable shaft 12 to be moved in the apertured spline bushings 21. Spring 58 connected between stationary base 22 and vertically movable frame 14 eliminates any backlash between the lead screw 16 and its internally threaded bushing 25. The spring 58 also eliminates any vertical looseness in the system. Annular wiper sleeve 59 is fixed in frame 14 and cooperates with movable plastic wiper seals 56. Spacer sleeve 57 is provided with an annular plenum which cooperates with the cross bored passage way 62 and vertical passageway 63 in pedestal 12. Vacuum lines 64 is connected to the annular plenum 61 by a hose fitting 65 in frame 14. An anti-backlash force means is provided by the pressure plate 66, wave washer 67 and the cap plate 68.

In a preferred embodiment the pedestal 12 is made in two parts so that the upper portion of the pedestal 12 may be removed. An O'ring seal 69 and clamp 71 are provided for affixing the upper portion of the pedestal 12 to the lower portion when the upper portion is made removable. The purpose for having a removable workstation 11 is so that different devices can be run on the same bonding machine without incurring set up time for modifications. Semiconductor device 72 is shown positioned opposite a wedge bonding tool 73 employed to make fine wire interconnections between a chip and lead-out pad on the lead frame of the semiconductor device 72. The semiconductor device 72 is shown in the bonding position where the pedestal 12 is extending upward through the aperture 74 in the boat 75. Such boats or holders are well known in the semiconductor industry and do not require further explanation here. When the frame 14 is moved to a retracted position by screw 16 the pedestal 12 moves downward and unloads the semiconductor device 72 in the aperture 74 and continues its downward movement. After the pedestal 12 and workstation 11 unloads the semiconductor device 72 the vacuum solenoid (not shown) is actuated to release the vacuum between the workstation 11 and the semiconductor 72. The boat 75 is then indexed to a new position to present a new semiconductor device over the workstation 11. A new cycle is started in which the vertical drive motor 24 is again actuated causing the screw 16 to raise the frame 14. Pedestal 12 with workstation 11 thereon is positioned to a rotary position to properly engage a new semiconductor device 72 and when fully extended to the bonding position the work station 11 unloads the semiconductor device from the boat 75. The bonding position is maintained during a bonding operation and the rotary drive motor 33 is positioned to a desired rotary position to cooperate with the wedge bonding tool 73 on the automatic wire bonder (not shown). When the bonding operation is completed the rotary drive motor 33 must again position the semiconductor device 72 back in its preferred rotary position for returning the semiconductor device 72 into the aperture 74 of the boat 75. As will be explained hereinafter the preferred height of the bonding position may be varied to achieve a desired degree of toe or heel of the wedge bonding tool 73 to achieve better bonds at first and second bond positions. It will be understood that magazines containing a plurality of boats 75 may be used with conjunction with automatic bonding machines for bonding hundreds of devices without operator attendance.

Refer to FIG. 2 showing in schematic form a controller processor 76 of the type employed with automatic wire bonders. Controller processor 76 is coupled to vertical drive motor 24, rotary drive motor 33, encoder 35 and to the vacuum solenoid valve (not shown). Electrical buses 77 interconnect controller processor 76 with motors 24, 33, encoder 35 and other electrical equipment (not shown).

Figure 4:
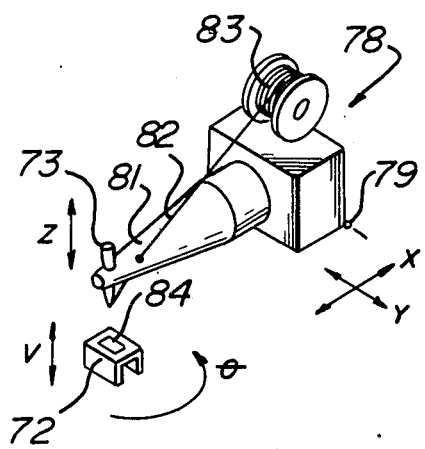
FIG. 4 is a schematic drawing showing the relative movement of a wedge bonding head and a semiconductor device.

Refer now to FIG. 4 schematically showing a bond head assembly for an automatic wedge wire bonder. Bonding head assembly 78 is mounted on a pivot on an X-Y table (not shown) on the automatic wire bonder base frame 23. Computer controlled X-Y tables are well known and do not require additional explanation here. The transducer horn 81 is shown having a wedge bonding tool 73 mounted therein. The fine wire 82 is threaded through the transducer 81 and a guide hole and the bonding tool 73. A spool of fine wire 83 is adapted to be employed for making the before mentioned fine wire interconnection on semiconductor device 72. Semiconductor device 72 is shown having a chip 84 thereon to be interconnected to the lead out pads on the semiconductor device 72. The semiconductor 72 is mounted on the workstation 11 and adapted to be positioned in a rotary or theta direction as well as in the vertical or V-direction as shown. The bond head assembly is movable in the X and Y direction and pivots to provide the third directions motion which is the Z motion as shown. The combination of the five motions shown enable the automatic wire bonder and the novel low inertia movable workstation to provide fast positioning of the semiconductor device at the bonding position and enables the automatic wire bonder to perform high speed wire bond interconnections without delays which would be caused by high inertia movement of heavy or large mass parts.

Figure 5:
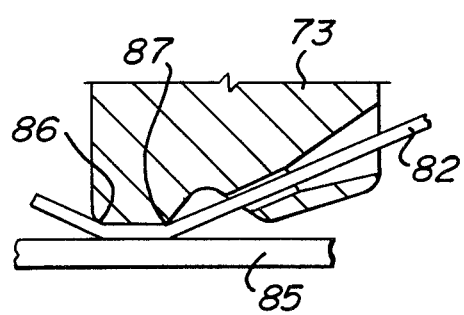
FIG. 5 is an enlarged side elevation in section showing a bonding wedge making a conventional second bond of a fine wire interconnection.
Figure 6:
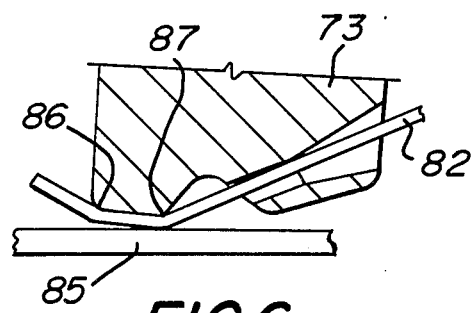
FIG. 6 is an enlarged side elevation of a bonding wedge of the type shown in FIG. 5 having the workstation elevated beyond the preferred bonding position to tilt the bonding wedge and to provide greater penetration of the heel of the bonding wedge into the fine wire.

Refer now to FIG. 5 showing a bonding wedge 73 engaging a fine wire 82 against a lead out pad 85 of the semiconductor device 72. It will be understood that the vertical axis of the bonding wedge 73 is normal to the surface of the lead out pad 85 and that the toe 86 and heel 87 of bonding wedge 73 are substantially horizontal and parallel to the surface of the lead out pad 85. When the workstation is raised relative to the bonding wedge 73 it causes the bonding wedge 73 to tilt backwards and the heel 87 of the bonding wedge 73 will penetrate deeper into the wire 82 during a bonding operation as shown in FIG. 6. Similarly when the workstation 11 is lowered from the neutral bonding position the bonding wedge 73 will tilt forward and the toe 86 of the bonding wedge 73 will penetrate deeper into the fine wire 82. FIG. 6 shows a bonding operation at second bond in which the workstation has been raised sufficiently to cause the heel 87 to engage deeper into the bonding wire doing a squash out or bonding operation. Heretofore bonding operations have been performed employing up to 4° toe and as much as 5° heel. In the preferred embodiment of the present invention every thirty onethousandths height adjustment creates a change of one-half of one degree heel or toe depending on the direction of height variation.

It will be appreciated that once the preferred bonding height position is established for either heel or toe operation that the height of the workstation 11 is preferably not changed during the bonding operation on a semiconductor device. However, it is possible to use the height adjustment of the workstation to advantage. When automatic optical recognition devices are employed to determine the rotational position and translational position of a chip 84 relative to its lead out pads, additional sensitivity and contrast enhancement may be provided by changing the vertical positions so that top of the semiconductor device is in the best possible focus for sensing by the optical recognition system. This position can be established by observing the monitor on the bonding machine to check the detail and focus of the image sensed by the optical recognition system. After using a different vertical height position for sensing rotational position the automatic wire bonder may be programmed to return the top of the semiconductor device back to a preferred neutral bonding position as explained hereinbefore.

Having explained a preferred embodiment of a low inertia movable workstation it will be appreciated that elimination of the heavy moving parts usually associated with positioning a rigid or stiff workstation can be accomplished by using a low inertia pedestal which supports a workstation and moving only the low inertia workstation while maintaining the heavy drive and encoding equipment in a fixed position. While the controller and its operation of the drive motors and encoders has not been explained in detail, such motors and encoders are known in the prior art for positioning and are operated by processor controllers of automatic wire bonders and should not require further explanation here.

We claim:

1. A low inertia movable workstation for a high speed automatic wire bonder, comprising:
   a stationary base mounted on said wire bonder,
   a vertical axis drive motor mounted on said stationary base,
   a rotational axis drive motor mounted on said stationary base,
   a vertical screw rotably mounted on said stationary base and coupled to said vertical axis drive motor,
   a vertically movable pedestal support frame coupled to said vertical screw and vertically movable by said screw, a pedestal rotably mounted in said pedestal support frame and vertically movable therewith, a workstation on said pedestal for supporting a semiconductor device opposite a bonding tool of an automatic wire bonder, a vertically movable coupling fixed to said pedestal, a vertically fixed complimentary coupling rotably mounted in said stationary base being rotably coupled to said vertically movable coupling and vertically fixed to said rotational axis drive motor, and control means coupled to said vertical axis drive motor and said rotational axis drive motor for positioning said workstation and said semiconductor device in a predetermined vertical and rotational position.

2. A low inertia movable workstation as set forth in claim 1 wherein said vertically movable coupling comprises a splined shaft connected to said vertically movable pedestal.

3. A low inertia movable workstation as set forth in claim 2 wherein said complimentary coupling comprises a hollow spindle tube having a first splined bushing fixed thereto adapted to rotate said spindle shaft.

4. A low inertia movable workstation as set forth in claim 3 wherein said complimentary coupling further includes a second splined bushing which is spring biased against said first splined bushing to provide an antibacklash coupling in cooperation with said splined shaft.

5. A low inertia movable workstation as set forth in claim 1 wherein said vertical screw is coupled to said vertical axis drive motor through a belt and pulleys.

6. A low inertia movable workstation as set forth in claim 5 wherein said vertical screw is coupled to said pedestal drive frame through a threaded bushing.

7. A low inertia movable workstation as set forth in claim 1 which further includes a holder for supporting a plurality of semiconductor devices in a position above said workstation when in a retracted position.

8. A low inertia movable workstation as set forth in claim 7 wherein said control means are adapted to actuate said vertical axis drive motor to cause said workstation to move vertically upward from a retracted position to a bonding position and for positioning a semiconductor device on said workstation.

9. A low inertia movable workstation as set forth in claim 8 which further includes vacuum means coupled to said workstation for unloading a semiconductor device from said holder when moving vertically upward from said retracted position to a bonding position.

10. A low inertia movable workstation as set forth in claim 9 wherein said vacuum means comprise a plenum in said pedestal support surrounding a portion of said pedestal and a hollow passageway in said pedestal to said workstation.

11. A low inertia movable workstation as set forth in claim 10 wherein said vacuum means further includes a vacuum solenoid operable by said control means.

12. A low inertia movable workstation as set forth in claim 9 wherein said vacuum means are operable by said control means for releasing a semiconductor device from said workstation when said workstation returns said semiconductor device to said holder after a bonding operation.

13. A low inertia movable workstation as set forth in claim 1 wherein said wire bonder further includes a bonding wedge and wherein said control means are operable to position a semiconductor device on said workstation at a predetermined bonding height which enables said wedge bonding tool to vertically engage a bonding wire with said semiconductor device.

14. A low inertia movable workstation as set forth in claim 13 wherein said control means are operable to raise said workstation to a height different from said predetermined bonding height to provide a tilted engagement angle of said wedge bonding tool with said semiconductor device at a bond position.

15. A low inertia movable workstation as set forth in claim 13 wherein said control means are operable to raise said workstation to a height different from said predetermined bonding height to provide a tilted wedge bonding tool at a bonding position.

16. A low inertia movable workstation as set forth in claim 13 wherein said control means are operable to raise said workstation to variable heights wherein the top of different semiconductors devices are positioned at said predetermined bonding height.

17. A low inertia movable workstation as set forth in claim 16 wherein said control means are operable to provide a tilt to said bonding wedge to improve bonds of said bonding wire.

18. A low inertia movable workstation as set forth in claim 13 wherein said control means are operable to position said semiconductor device to a height which enhances pattern recognition before positioning said semiconductor device to said predetermined bonding height.

19. A low inertia movable workstation for a high speed automatic wire bonder, comprising:

a workstation base mounted on said wire bonder, a vertical axis drive motor mounted on said workstation base, a vertical screw coupled to said vertical axis drive motor and rotably mounted on said workstation base, a hollow pedestal housing rotably mounted on said workstation base, a bushing guide mounted on said hollow pedestal housing, a pedestal slidably mounted through said bushing guide on said hollow pedestal housing, a pedestal drive frame coupled to said vertical screw and vertically movable by said vertical axis drive motor, said pedestal drive frame being fixed to said pedestal for vertical movement and providing a guide for rotational movement of said pedestal, a semiconductor device workstation mounted on top of said pedestal and being adapted to hold a semiconductor device thereon opposite a bonding tool during a bonding operation, a rotational theta drive motor coupled to said hollow pedestal housing for positioning said semiconductor device in a predetermined rotational position, and control means coupled to said theta drive motor and to said vertical axis drive motor for positioning a semiconductor device supported on said workstation in a predetermined rotational and vertical position opposite said bonding tool without vertical movement of said vertical axis drive motor and said theta drive motor.

* * * * *